United States Patent [19]
Lin

[11] Patent Number: 5,907,295
[45] Date of Patent: May 25, 1999

[54] AUDIO SAMPLE-RATE CONVERSION USING A LINEAR-INTERPOLATION STAGE WITH A MULTI-TAP LOW-PASS FILTER REQUIRING REDUCED COEFFICIENT STORAGE

[75] Inventor: Tao Lin, Fremont, Calif.

[73] Assignee: NeoMagic Corp., Santa Clara, Calif.

[21] Appl. No.: 08/905,458

[22] Filed: Aug. 4, 1997

[51] Int. Cl.[6] .................................................. H03M 7/00
[52] U.S. Cl. ............................................... 341/61; 341/50
[58] Field of Search .................... 341/61, 50; 364/724.1, 364/724.01

[56] References Cited

U.S. PATENT DOCUMENTS

| | | | |
|---|---|---|---|
| 4,725,972 | 2/1988 | Gockler | 364/724 |
| 5,369,606 | 11/1994 | Hessel | 364/724.16 |
| 5,400,315 | 3/1995 | Koishi et al. | 369/124 |
| 5,416,847 | 5/1995 | Boze | 381/98 |
| 5,450,083 | 9/1995 | Brewer | 341/143 |
| 5,461,604 | 10/1995 | Hasegawa | 369/124 |
| 5,471,411 | 11/1995 | Adams et al. | 364/724.01 |
| 5,524,171 | 6/1996 | De Boisriou | 395/2.36 |
| 5,570,308 | 10/1996 | Ochi | 364/724.1 |
| 5,590,065 | 12/1996 | Lin | 364/724.1 |
| 5,594,675 | 1/1997 | Peng | 364/724.1 |
| 5,619,197 | 4/1997 | Nakamura | 341/50 |
| 5,621,675 | 4/1997 | Linz et al. | 364/724.1 |

OTHER PUBLICATIONS

Rabiner & Crochiere, "A Novel Implementation for Narrow–Band FIR Digital Filters" IEEE Trans Acoustics, Speech, & Sig. Proc, vol. ASSP–23, No. 5, Oct. 1975, pp. 457–464.

Crochire & Rabiner, "Further Considerations in the Design of Decimators and Interpolators" IEEE Trans Acoustics, Speech, & Sig. Proc, vol. ASSP–24, No. 4, Aug. 1976, pp. 296–311.

Crochiere & Rabiner, "Optimum FIR Digital Filter Implemetations for Decimation, Interpolation, and Narrow–Band Filtering" IEEE Trans Acoustics, Speech, & Sig. Proc, vol. ASSP–23, No. 5, Oct. 1975, pp. 444–456.

*Primary Examiner*—Marc S. Hoff
*Assistant Examiner*—Peguy JeanPierre
*Attorney, Agent, or Firm*—Stuart T. Auvinen

[57] ABSTRACT

Audio sample rates are converted by an arbitrary ratio of Q/P using a two-stage sample-rate converter. One stage is an L-tap low-pass finite-impulse-response (FIR) filter, while the other stage is a linear interpolator. Coefficient storage for the L-tap low-pass FIR filter is dramatically reduced by reducing the effective P factor. The effective P factor is reduced by using two stages, with each stage adjusting the sampling rate by a different ratio. A first stage adjusts the sampling rate by Q0/P0, while a second stage further adjusts the sampling rate by Q1/P1. Q0 and P0 are large integers of about 400 to 700 that differ by one or three; thus the ratio Q0/P0 is very close to one. The linear interpolator stage eliminates or adds one or three samples and smoothes the samples by linear interpolation over the 400 to 700 remaining samples. The FIR filter stage adjusts the sample rate by a ratio of Q1/P1, which is approximately but not exactly Q/P. The FIR filter smoothes the expanded or reduced samples using weighting coefficients. Only P1 sets of coefficients are stored, rather than P sets. Since P1 is only about 10, while P is 400 to 700, coefficient storage is dramatically reduced.

12 Claims, 10 Drawing Sheets

| Rates | Q/P |
|---|---|
| 11.025KHz to 8KHz | 441/320 |
| 11.025KHz to 16KHz | 441/640 |
| 11.025KHz to 32KHz | 441/1280 |
| 11.025KHz to 48KHz | 147/640 |
| 22.05KHz to 8KHz | 441/160 |
| 22.05KHz to 16KHz | 441/320 |
| 22.05KHz to 32KHz | 441/640 |
| 22.05KHz to 48KHz | 147/320 |
| 44.1KHz to 8KHz | 441/80 |
| 44.1KHz to 16KHz | 441/160 |
| 44.1KHz to 32KHz | 441/320 |
| 44.1KHz to 48KHz | 147/160 |
| 8KHz to 11.025KHz | 320/441 |
| 8KHz to 22.05KHz | 160/441 |
| 8KHz to 44.1KHz | 80/441 |
| 16KHz to 11.025KHz | 640/441 |
| 16KHz to 22.05KHz | 320/441 |
| 16KHz to 44.1KHz | 160/441 |
| 32KHz to 11.025KHz | 1280/441 |
| 32KHz to 22.05KHz | 640/441 |
| 32KHz to 44.1KHz | 320/441 |
| 48KHz to 11.025KHz | 640/441 |
| 48KHz to 22.05KHz | 320/441 |
| 48KHz to 44.1KHz | 160/147 |

Prior Art

FIG. 2

| Rates | Q/P | Q0/P0 | Q1/P1 |
|---|---|---|---|
| 11.025KHz to 8KHz | 441/320 | 441/440 | 11/8 |
| 11.025KHz to 16KHz | 441/640 | 637/640 | 9/13 |
| 11.025KHz to 32KHz | 441/1280 | 637/640 | 9/26 |
| 11.025KHz to 48KHz | 147/640 | 637/640 | 3/13 |
| | | | |
| 22.05KHz to 8KHz | 441/160 | 441/440 | 11/4 |
| 22.05KHz to 16KHz | 441/320 | 441/440 | 11/8 |
| 22.05KHz to 32KHz | 441/640 | 637/640 | 9/13 |
| 22.05KHz to 48KHz | 147/320 | 637/640 | 6/13 |
| | | | |
| 44.1KHz to 8KHz | 441/80 | 441/440 | 11/2 |
| 44.1KHz to 16KHz | 441/160 | 441/440 | 11/4 |
| 44.1KHz to 32KHz | 441/320 | 441/440 | 11/8 |
| 44.1KHz to 48KHz | 147/160 | 637/640 | 12/13 |
| | | | |
| 8KHz to 11.025KHz | 320/441 | 440/441 | 8/11 |
| 8KHz to 22.05KHz | 160/441 | 440/441 | 4/11 |
| 8KHz to 44.1KHz | 80/441 | 440/441 | 2/11 |
| | | | |
| 16KHz to 11.025KHz | 640/441 | 640/637 | 13/9 |
| 16KHz to 22.05KHz | 320/441 | 440/441 | 8/11 |
| 16KHz to 44.1KHz | 160/441 | 440/441 | 4/11 |
| | | | |
| 32KHz to 11.025KHz | 1280/441 | 640/637 | 26/9 |
| 32KHz to 22.05KHz | 640/441 | 640/637 | 13/9 |
| 32KHz to 44.1KHz | 320/441 | 440/441 | 8/11 |
| | | | |
| 48KHz to 11.025KHz | 640/441 | 640/637 | 13/3 |
| 48KHz to 22.05KHz | 320/441 | 640/637 | 13/6 |
| 48KHz to 44.1KHz | 160/147 | 640/637 | 13/12 |

FIG. 4

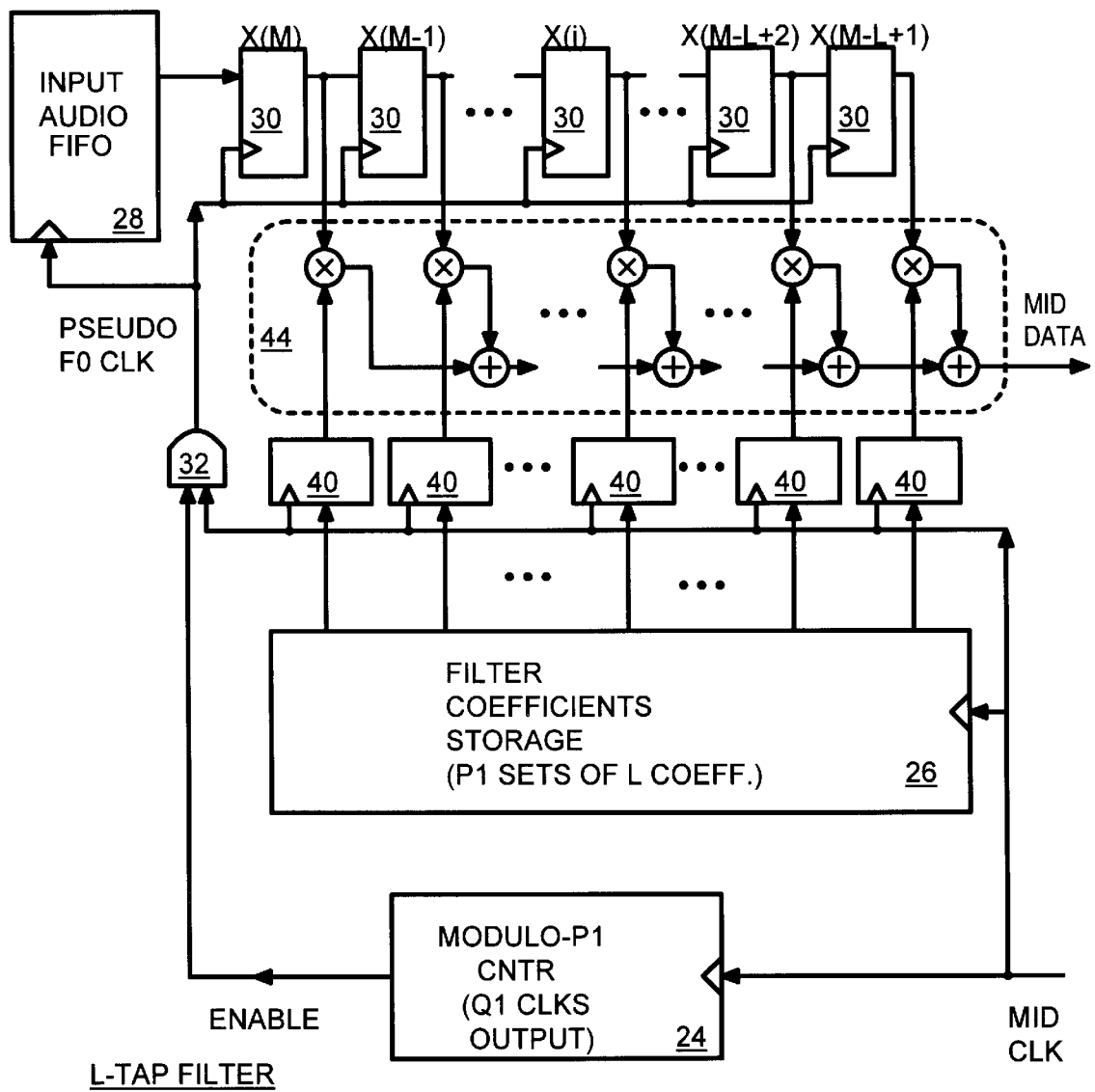
UP SAMPLING　　FIG. 5A

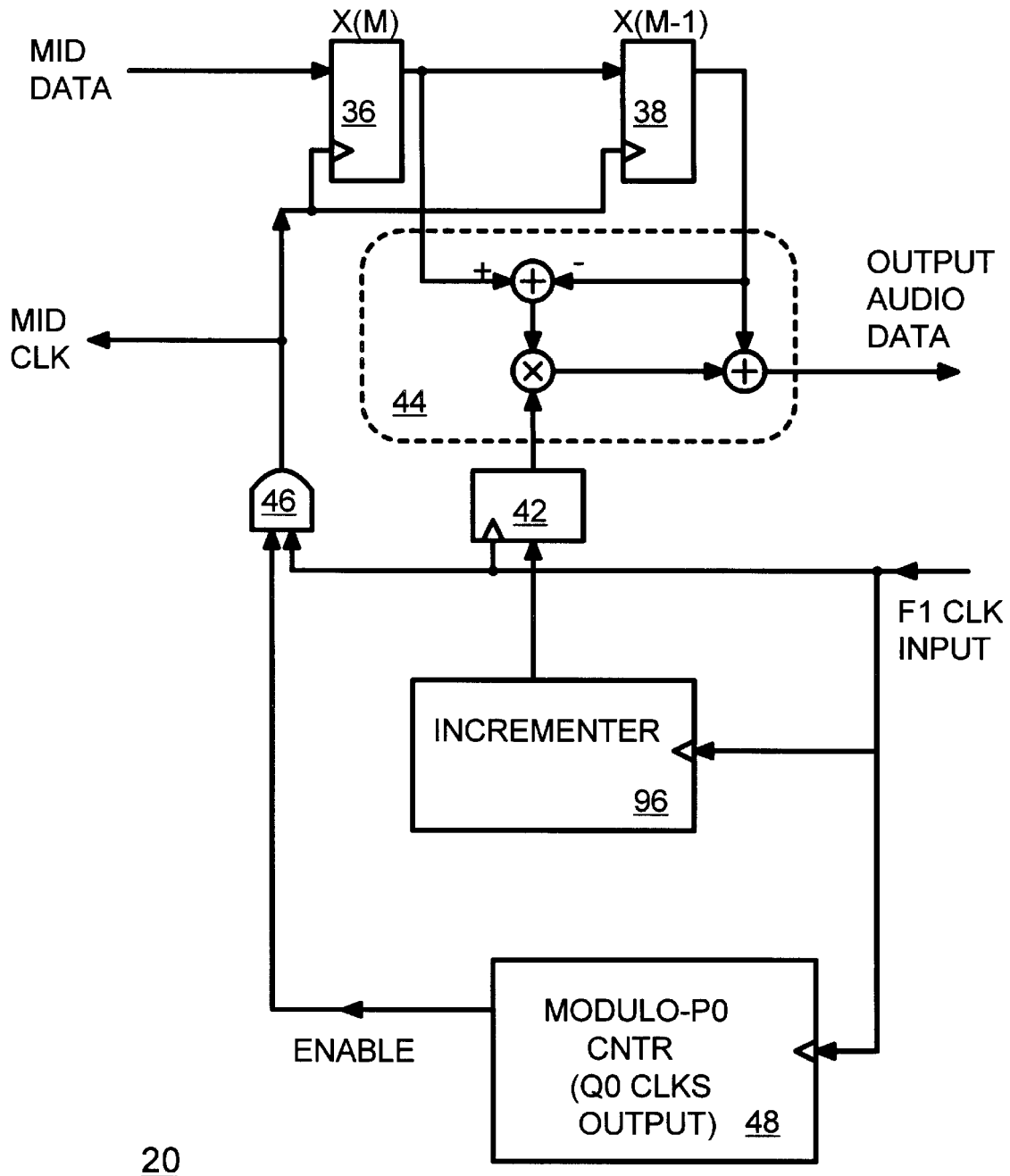
FIG. 5B LINEAR INTERPOLATOR UP SAMPLING

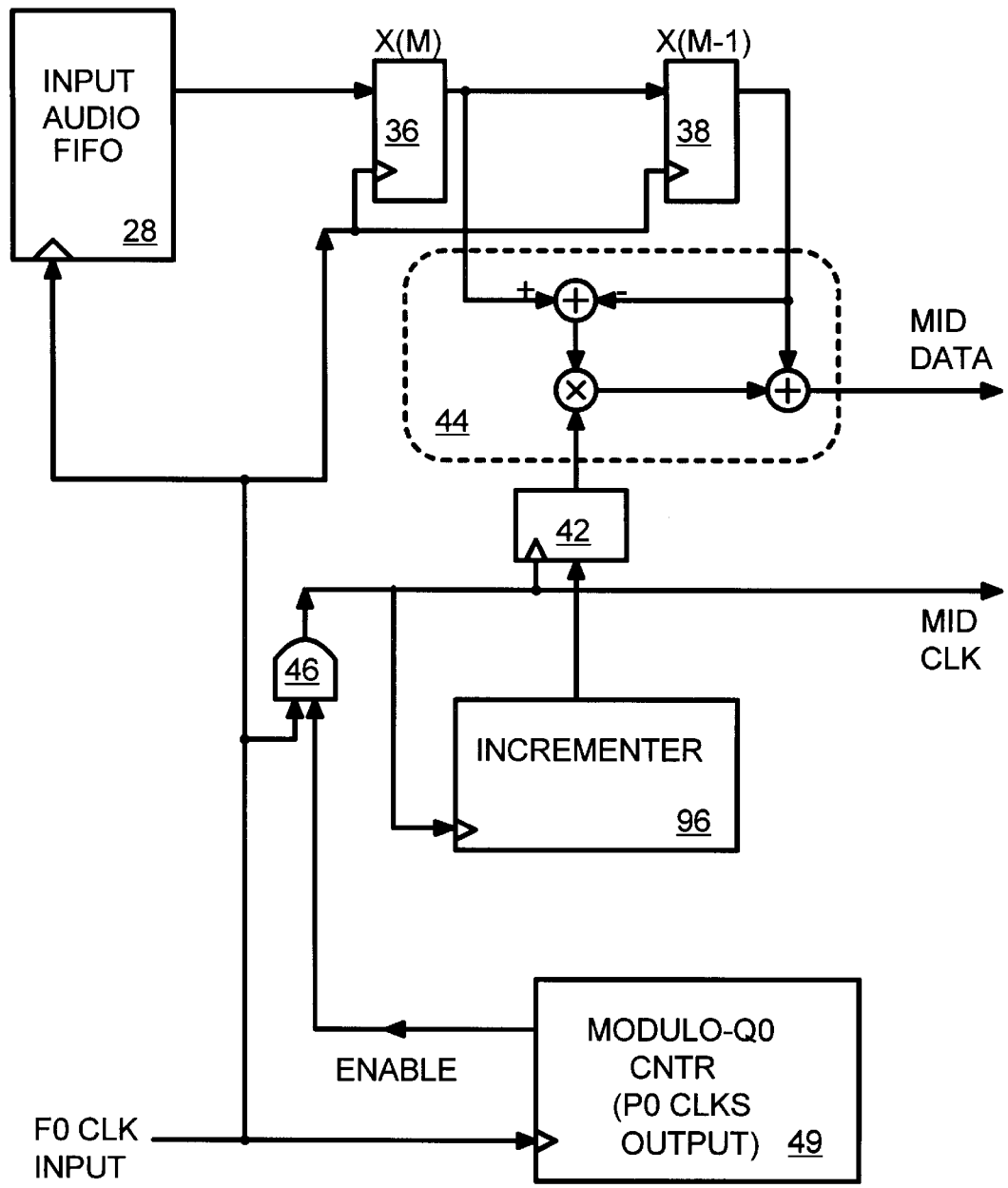
FIG. 8A — LINEAR INTERPOLATOR DOWN SAMPLING

AUDIO SAMPLE-RATE CONVERSION USING A LINEAR-INTERPOLATION STAGE WITH A MULTI-TAP LOW-PASS FILTER REQUIRING REDUCED COEFFICIENT STORAGE

BACKGROUND OF THE INVENTION

Field of the Invention

This invention relates to sample-rate conversion in audio systems, and more particularly to digital filters and interpolators used for rate conversion.

BACKGROUND OF THE INVENTION

Description of the Related Art

Digital-audio systems are becoming commonplace, even on inexpensive personal computers (PC's). Audio inputs are often sampled at a rate of 11.025, 22.05, or 44.1 KHz, or at rates of 8, 16, 32, or 48 KHz. These audio samples are often stored and altered in a PC before being played back, often at a different rate.

It may be desired to mix audio samples having different sample rates. One of the audio samples must be converted to the sample rate of the other audio sample for mixing to occur. Sample-rate conversion software or hardware is used to convert the sample rate.

While many approaches to sample-rate conversion are used, satisfactory results are not always achieved. The human ear is quite sensitive to slight distortions or discontinuities of a sound. Coarse sample-rate conversion produces noticeable distortion. While some rates are easily converted, as when one rate is a multiple of another, other rate conversions without common multiples are difficult. For example, an 8-KHz sample is easily converted to 16 KHz using low common multiples, but the 8-KHz sample cannot easily be converted to 11.025 KHz since the lowest common multiples are 441 and 320.

FIG. 1 shows a prior-art sample-rate converter using three conceptual stages. An input audio stream was sampled at frequency f0, and has samples x(0), x(1), . . . x(m). Each sample is a multi-bit binary number representing the intensity of the sound at a point in time; 16-bit binary numbers in two's complement are commonly used for each sample. The input sample at frequency f0 is to be converted to the output audio stream having a sample rate of f1, with samples y(0), y(1), . . . y(n). The number of sample points in the input stream, m, differs from the number of samples in the output stream, n. The ratio of the number of samples, m/n, is equal to the frequency ratio f0/f1. The converted audio stream must have the same total play time, even though the number of samples increases or decreases and the rate of sample play back likewise increases of decreases.

The input audio stream is first up-sampled by expander 12. Each input sample x(i) is expanded to P samples by inserting P-1 zeros between input samples. Next, the expanded stream from expander 12 is filtered by low-pass filter 14 to remove high-frequency sampling-induced alias noise. A finite-impulse-response (FIR) filter can be used where each filtered sample output is a weighted average of L prior input samples. The filtered stream from low-pass filter 14 is then reduced by a factor of Q using decimator 16. Decimator 16 skips Q-1 samples for every Q consecutive samples output from low-pass filter 14 to generate each output sample y(i) in the output audio stream. The expander and decimator are typically embedded in the control logic of the low-pass filter.

Large Integers Required for Common Audio Conversions

The sample rate is converted by the ratio of Q/P, where P and Q are integers. The ratio of the frequencies, f0/f1, is equal to the ratio Q/P. Thus selecting appropriate values for Q and P allows rate conversion to the desired output rate. Unfortunately, integer values for Q and P are large for sample rates without common multipliers. For example, conversion from 11.025 KHz to 8 KHz requires a Q of 441 and a P of 320. Smaller integers for Q and P do not exist that exactly produce a ratio of 16/11.025.

Large values for P are problematic because low-pass filter 14 requires P sets of coefficients for weighting the L previous inputs. Since each set of coefficients has L numerical values, a total of P*L coefficients must be stored for low-pass filter 14. For a typical 16-tap filter (L=16), 320*16= 5120 coefficients are stored.

FIG. 2 is a table of common sample rate conversions for personal computer audio systems. The lowest prime integers producing a Q/P ratio equal to the frequency ratio are shown. Simple conversions using low common multiples, such as conversion from 8 KHz to 16 KHz, are omitted. The values of P range from 147 to 1280, with many conversions requiring a P of 441 or more. The prior art sample-rate converter of FIG. 1 requires enough coefficient storage for the largest P used, 1280, for 11.025 KHz to 32 KHz conversion. Coefficient storage thus requires 1280*L values or over 20,000 numeric values.

What is desired is a sample-rate converter for common PC-audio sample rates. It is desired to reduce coefficient storage. A sample-rate converter having fewer stages is also desirable. High audio quality must not be sacrificed.

BRIEF DESCRIPTION OF THE DRAWINGS

FIG. 2 is a table of common sample rate conversions for personal computer audio systems.

FIG. 4 is a table of Q and P integers for the filter and interpolator stages for various sample-rate conversions.

FIGS. 5A, 5B show in detail a 2-stage sample rate converter configured for up sampling.

FIGS. 8A, 8B show in detail the 2-stage sample rate converter configured for down sampling.

DETAILED DESCRIPTION

The present invention relates to an improvement in audio sample-rate conversion. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Two Stage Sample-Rate Converter

The inventor has realized that the coefficient storage for the L-tap low-pass finite-impulse-response (FIR) filter can be reduced if the factor P can be reduced. The inventor reduces the factor P by using two stages, with each stage adjusting the sampling rate by a different ratio. A first stage adjusts the sampling rate by Q0/P0, while a second stage further adjusts the sampling rate by Q1/P1.

The ratio of Q/P must equal the frequency ratio, f0/f1 for the input and output audio streams. For two stages, the equation f0/f1=Q/P is expanded to f0/f1=(Q0/P0)*(Q1/P1). A single P factor is no longer used; rather two P factors P0, P1 are used, as are two Q factors Q0, Q1. Any integer values for Q0, Q1, P0, P1 may be chosen as long as the result (Q0/P0)*(Q1/P1) equals Q/P or f0/f1.

One of the two stages contains the L-tap low-pass FIR filter; the P-value for this stage, P1, determines the coefficient storage required. The other stage does not contain a FIR filter and thus its P value, P0, can be large. Using two stages allows the P factor to be adjusted while still achieving an exact overall ratio of sampling rates.

Figure 3A:
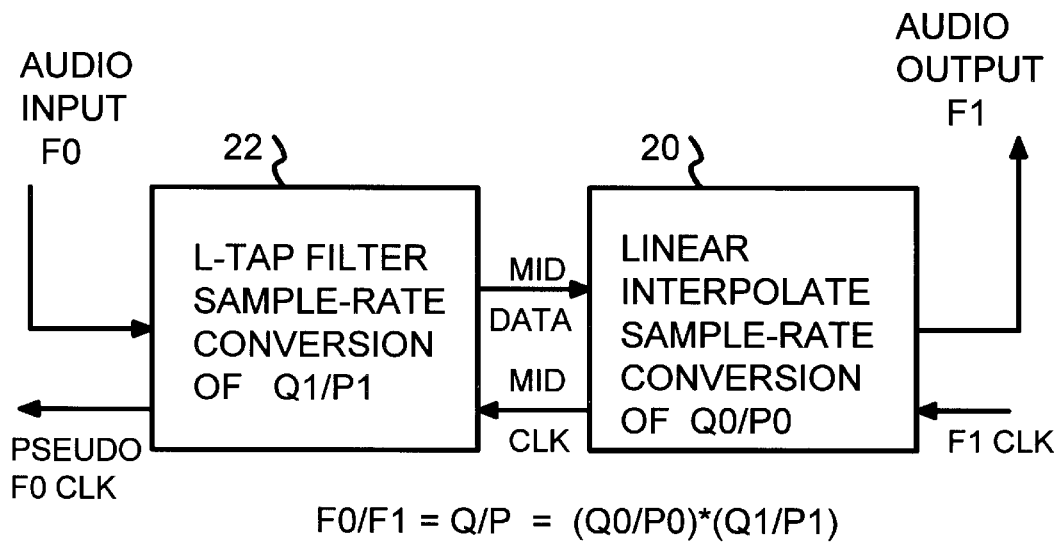
FIG. 3A is a diagram of a two-stage sample rate converter configured for up-sampling to a higher frequency.

FIG. 3A is a diagram of a two-stage sample rate converter configured for up-sampling to a higher frequency. The audio input samples at frequency f0 are expanded to the higher frequency f1 of the output audio stream. The audio input samples are increased in sample rate by the ratio Q1/P1 by L-tap FIR filter 22. Filter 22 reads the L previous samples and averages them together using weighting coefficients. Filter 22 provides a low-pass filter to remove sampling-inducted alias errors and to smooth the output. The ratio of Q1/P1 is chosen to be about, but not exactly equal to, the overall ratio of Q/P. Thus the bulk of the sample-rate conversion is performed by filter 22. For example, an 8-KHz input can be up-sampled to 11.025 KHz using a Q1/P1 ratio of 8/11. This ratio is not quite equal to the Q/P ratio of 8/11.025, but is very close. The difference between 11 and 11.025 for P1 is significant enough to produce audible distortions, so a second stage is needed to produce the exact overall ratio.

The filtered output from filter 22 is sent to linear interpolator 20, which performs a linear interpolation on the samples to increase the sample rate by an additional ratio of Q0/P0. However, Q0/P0 is very close to 1.0, so the adjustment is very slight. Linear interpolation is well suited for such slight adjustments since its accuracy is enhanced for smaller changes compared with larger changes or steps.

Coarse Filter & Fine Interpolator

Larger integers are used for P0 and Q0 than for P1 and Q1. The values for P1 and Q1 can be kept under thirty even when Q and P are in the hundreds. In the 8 to 11.025-KHz example, where Q1/P1 is 8/11, Q0/P0 is 440/441 to achieve the overall Q/P ratio of 8/11.025. Linear interpolator 20 adds one sample point for every 440 sample points from filter 22 to change the number of samples from 440 to 441, a ratio of 440/441. Simply duplicating one sample point produces an audible distortion, so instead linear interpolation is used to smooth out the effect of adding a few sample points.

Thus a coarse sample-rate adjustment is performed by L-tap FIR filter 22, while a fine adjustment is made by linear interpolator 20. Together, the two stages produce the desired exact ratio of sample rates. Large integers are used for P0, Q0 for the linear interpolator to improve accuracy, while small integers are used for Q1, P1 for the L-tap filter.

Coefficient Storage Cut By 98%

Figure 1:
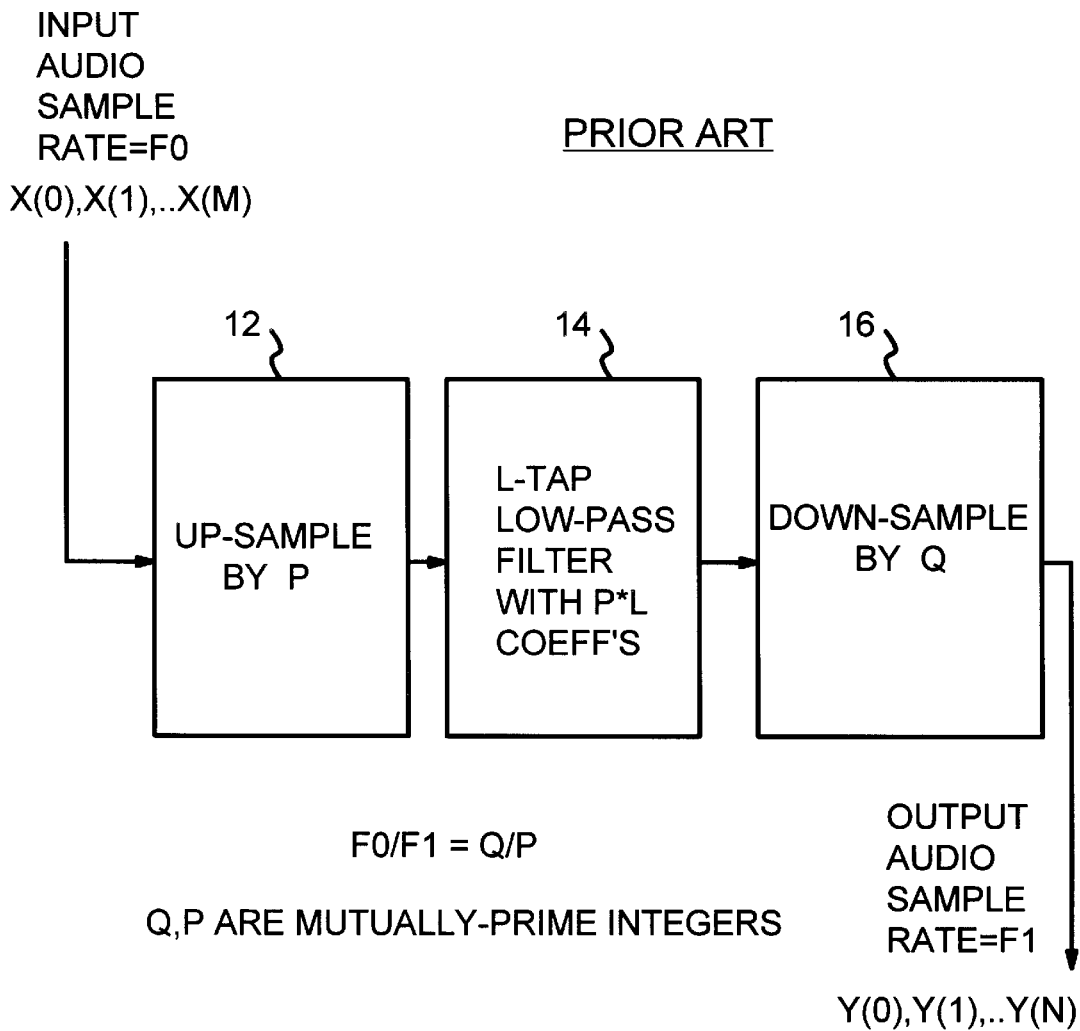
FIG. 1 shows a prior-art sample-rate converter using three conceptual stages.

The small integer for P1 drastically reduces the coefficient storage required for the FIR filter, since P1 sets of L coefficients are stored. For example, the prior-art filter of FIG. 1 uses a Q/P ratio of 320/441 for 8-KHz to 11.025-KHz up-sampling, which requires P sets of L coefficients, or 441*16=7065 coefficients for a 16-tap filter (L=16). The invention of FIG. 3A uses a Q1/P1 ratio of 8/11, or a P1 of 11. Only 11*L=176 coefficients need to be stored for a 16-tap filter using the invention. Coefficient storage is thus reduced by 97%.

Order of Stages Reversed for Down-Sampling

Figure 3B:
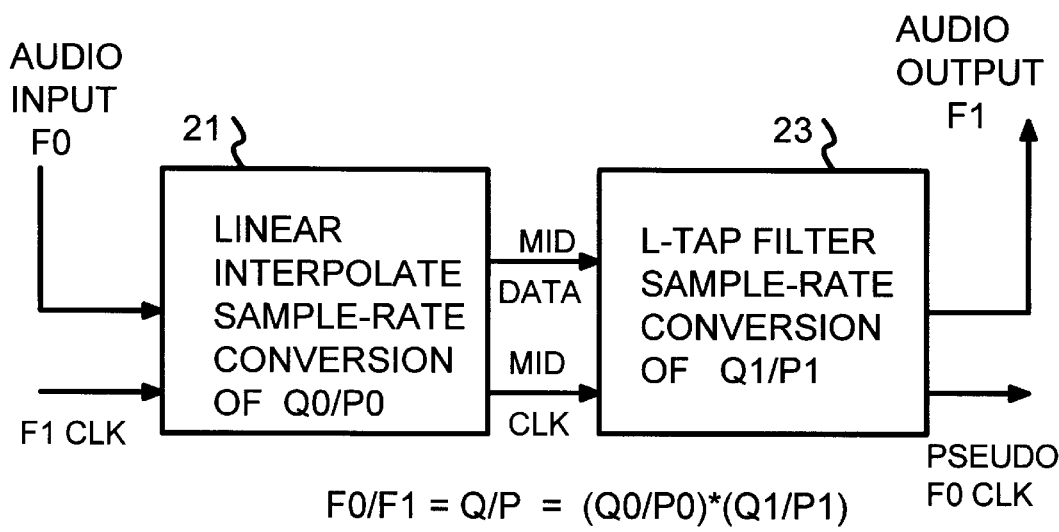
FIG. 3B is a diagram of a two-stage sample rate converter configured for down-sampling to a lower frequency.

FIG. 3B is a diagram of a two-stage sample rate converter configured for down-sampling to a lower frequency. Reducing the sample rate is achieved by reversing the order of the two stages; linear interpolator 21 receives the input audio stream and slightly decreases the sampling rate by the ratio Q0/P0, which is very close to 1.0, although larger integers are used for Q0 and P0. Linear interpolator 21 is followed by L-tap FIR filter 22, which averages the previous L samples from linear interpolator 21 to remove sampling-induced alias errors. L-tap FIR filter 23 decreases the sampling rate by the ratio Q1/P1, although small integers are used for Q1 and P1 to reduce coefficient storage requirements.

Faster Clock Used to Generate Slower Clock

L-tap FIR filters 22, 23 and linear interpolators 20, 21 change the sampling rate by skipping clock cycles of inputs or outputs, effectively increasing or decreasing the number of samples. The higher-frequency clock, either the audio input (f0) clock or audio output (f1) clock, is used to derive the lower-frequency clock. In FIG. 3A, the higher frequency clock is the audio output clock at frequency f1. Thus the audio output (f1) clock is used to generate the audio input (f0) clock. Linear interpolator 20 skips a few clocks every few hundred cycles of the audio output cock to generate a mid clock. The mid clock is sent to filter 22 and is further divided down by the ratio Q1/P1 to produce an audio input clock of the lower frequency f0. While the higher-frequency output clock is a free-running clock, the generated input clock is not a perfectly symmetric clock, as many clock pulses are longer than others since the clock was generated by skipping pulses of the higher-frequency clock.

In FIG. 3B, the higher-frequency clock is the audio input (f0) clock. Linear interpolator 21 receives the audio input clock and derives a mid clock by skipping a clock pulse every few hundred clock cycles. The mid clock is divided down by the ratio Q1/P1 by filter 23 to generate the audio output clock at the lower frequency f1.

First-in-first-out FIFO buffers (not shown) are used to buffer the input and output audio streams, allowing the input or output clock to skip cycles while maintaining a continuous output. Alternatively, input or output data can be accessed directly in a memory, such as for a stored audio clip in a PC's memory. Thus non-symmetric clocks are easily accommodated.

Q1, P1, Q0, P0 Values—FIG. 4

FIG. 4 is a table of Q and P integers for the filter and interpolator stages for various sample-rate conversions. Up-sampling occurs when the output rate exceeds the input rate, while down-sampling occurs when the output rate is less than the input rate. Simple rate conversions such as 8 to 32 KHz are not shown; only those complex conversions having large common multiples.

The linear interpolator stage reduces or increases the sample rate by a very small amount, deleting or adding one sample for every few hundred samples. For example, many conversions use a Q0/P0 ratio of 637/640, which adds three samples for every 637 samples. The ratio 637/640 is 0.9953, almost 1.0. Other conversions delete only one sample for each 441 samples, having Q0/P0 of 441/440.

The L-tap FIR filter stage performs a coarse rate conversion, either up or down. Small integers are used for Q1 and P1. The largest P1 value is 26, much less than 1280 for the prior art of FIG. 2. This is a 98% reduction in storage requirements for coefficients.

L-Tap FIR Filter for Up-Sampling—FIG. 5A

FIGS. 5A, 5B show in detail a 2-stage sample rate converter configured for up sampling. FIG. 5A shows the first stage, containing L-tap FIR filter 22, while FIG. 5B shows the second stage, with linear interpolator 20. A mid clock generated from the downstream linear interpolator stage is the higher-frequency audio output clock divided down slightly by the ratio Q0/P0. One clock pulse is skipped for every few hundred clock pulses. This mid clock is further divided down by the ratio Q1/P1 by modulo-P1 counter 24. Counter 24 enables Q1 clock pulses for every P1 clock pulses received from the mid clock. For example, when Q1/P1 is 9/13, counter 24 is configured to be a modulo-13 counter which enables 9 clock pulses for every 13 pulses input. The enable output from counter 24 controls AND gate 32 to gate off or disable some of the clock pulses of mid clock, which is also input to AND gate 32. The output of AND gate 32 is a pseudo-f0 clock, having an average frequency of f0, but not having equal periods for each individual clock pulse, since many clock pulses have been skipped or disabled.

This pseudo-f0 clock output from AND gate 32 is used to clock audio input data out of FIFO 28 and sequentially through data registers 30. Each register in data registers 30 is a multi-bit register containing a multi-bit binary value representing the audio intensity at a sample point. Unsigned or two's complement values may be used. For an L-tap filter, there is a series of L data registers 30, containing the last L sample points. The most recent sample point at time m is x(m) in the left-most register, while the oldest sample point x(m−L+1) is in the right-most register.

Filtering is performed by averaging these L sample points from data registers 30. A weighting coefficient is multiplied with each sample point, and then the sum of all weighted sample points is generated and output as the filtered sample point for time m. The sum is the mid data sent to the linear interpolator stage. A different sum is generated for each pulse of the mid clock from the linear interpolator stage. Since audio sample rates, in the KHz range, are much less than digital-signal-processing (DSP) clock rates (in the MHz), a firmware routine executing on a DSP can perform the multiplications and additions for the filter. Thus DSP 44 performs a loop for each of the L taps, reading a values from one of data registers 30 and multiplying it with the corresponding weighting coefficient from coefficient registers 40. The results are accumulated in temporary storage and the final sum is output as the filtered sample point at time m, the mid data.

The L weighting coefficients are latched by coefficient registers 40 before being multiplied with the L sample points from data registers 30. Coefficients registers 40 and coefficient storage 26 are clocked by the mid clock generated by the second stage, the linear interpolator.

Coefficient storage 26 contains P1 sets of weighting coefficients; each set contains L coefficients. Efficient filters require that the L coefficients vary with each other, and that a different set of L coefficients be used for each clock cycle. These coefficients are derived from a FIR filter with the order P1*L and a cutoff frequency of π/P1. A variety of standard techniques can be used to design the FIR filter.

Coefficient storage 26 is significantly reduced compared with the prior art, since only P1 sets of coefficients are stored, rather than P sets. Since P1 is much smaller than P, (See FIG. 4) storage requirements are reduced by as much as 98%.

Linear Interpolator—FIG. 5B

FIG. 5B shows the second stage for up sampling, using linear interpolator 20. The higher-frequency clock is the audio output clock at frequency f1. This clock is a free-running clock, perhaps generated by a clock divider or phase-locked loop (PLL). This audio input clock is divided down by the ratio Q0/P0 by modulo-P0 counter 48. Counter 48 outputs Q0 clock pulses for every P0 pulses of the audio input clock. Since the ratio Q0/P0 is very close to 1.0, only a few clock pulses are skipped for every hundred pulses of the audio input clock. Counter 48 distributes the skipped clock pulses over time so that pluses are not consecutively skipped.

The enable signal output from counter 48 is used by AND gate 46 to gate off a few of the pulses of the audio input clock, which is also input to AND gate 46. The mid clock to filter 22 of the first stage (FIG. 5A) is output from AND gate 46. This mid clock is used to synchronize the generation of the filtered mid data which is clocked into linear register 36 and then to previous linear register 38. These registers 36, 38 are also clocked by the mid clock.

Linear interpolation between filtered sample fx(n) in register 36 and the previous filtered sample fx(n−1) in register 38 is performed by DSP 44. The difference between the filtered sample in register 36 and the previous filtered sample in register 38 is generated, and this difference is multiplied by an increment from increment register 42. The result of the difference multiplied by the increment is added to the previous filtered sampled fx(n−1) from register 38 and output as the audio data output. Thus the output audio sample is interpolated between the two filtered samples in register 36, 38.

Incrementer 96 and increment register 42 are clocked by the free-running audio input clock. Thus a sample point is generated by interpolation for each pulse of the free-running audio input clock, which is the highest-frequency audio clock. Incrementer 96 generates an increment equal to the fractional Q0/P0, which is very close to, but slightly less than one. Each audio-input clock adds Q0/P0 to the last increment, so that the increment increases with time. However, the increments are truncated so that only the fractional parts are used. As a simple example, assume Q0/P0 is 0.9. The increments generated by incrementer 96 after each audio-input clock are then 0.9, 0.8 (1.8 truncated), 0.7, 0.6. 0,5, 0,4 . . . 0.2, 0.1, 0.0. These increments cause the interpolated results to initially be close to the fx(n) value, but gradually shift closer to the previous fx(n−1) value.

Incrementer 96 is programmed to cycle through P0 increments of Q0/P0 for every P0 clock pulses. The incrementer is reset to 0.0 after P0 samples, allowing the added sample to be generated when the mid clock pulse is disabled. Thus the extra sample point is smoothed with the other Q0 samples by linear interpolation. This is shown graphically in FIG. 6.

Figure 6:
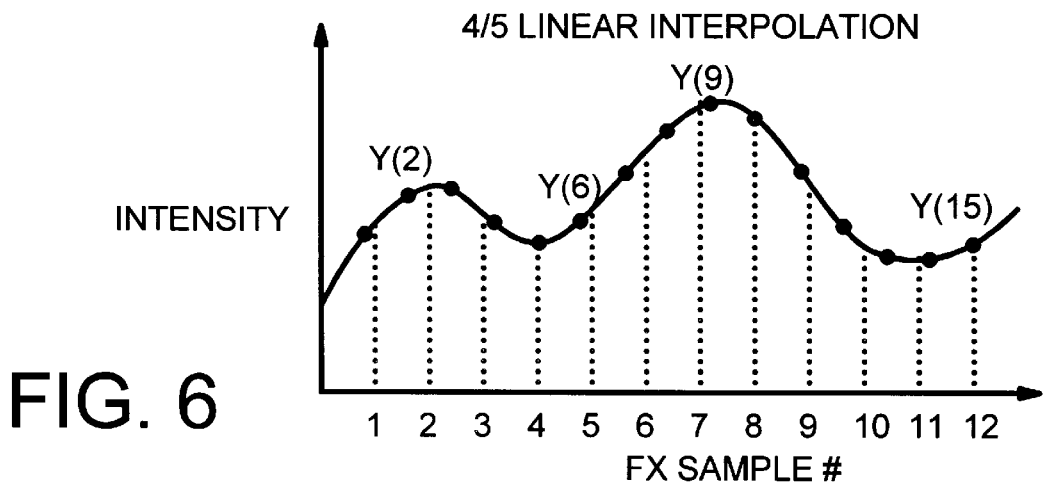
FIG. 6 is a graph of a simplified illustration of linear interpolation.

Linear Interpolation Example—FIG. 6

FIG. 6 is a graph of a simplified illustration of linear interpolation. In this simplified example, Q0 is 4 and P0 is 5. Every fifth output clock pulse is skipped by the mid clock, so the 4 sample points must be expanded by linear interpolation to 5 sample points. The Q0/P0 increment is 0.20 so that four input samples (mid data) are needed to generate every five samples. The horizontal axis shows the input sample points fx(n), for n=1 to 12. The vertical axis represents the audio intensity represented by each sample point. The dots on the curve represent the interpolated samples outputted by the linear interpolator. While there are 12 sample points input to the linear interpolator, there are 15 samples output, from y(1) to y(15).

The decreasing increment output from incrementer 96 of FIG. 5B causes the output y(i) samples generated to gradually shift from the current sample fx(i) to the previous sample point fx(i−1). Thus the number of samples are gradually expanded from 12 to 15. Each fourth input sample generates two output samples, as can be seen by the two y values appearing just before the input sample fx(4), fx(8), and fx(12).

In the actual linear interpolator, the Q0 and P0 values are much larger so that only one extra sample is generated for every 200 or more input samples. Thus the interpolated values are smoothed much more gradually and accurately than in the simplified example of FIG. 6.

Figure 7:
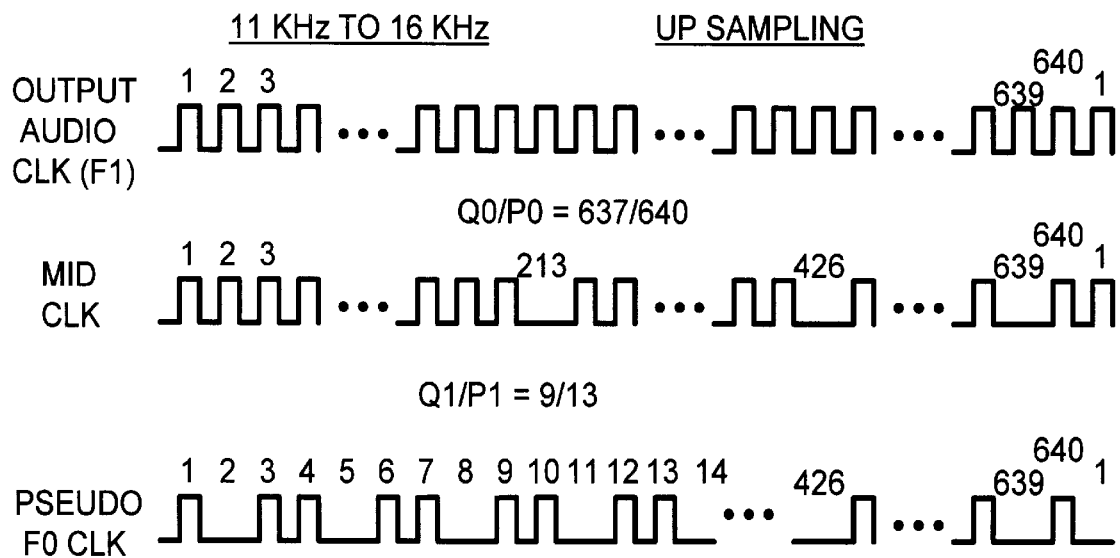
FIG. 7 illustrates how the clocks are generated for up sampling.

Clock Generation for Up-Sampling—FIG. 7

FIG. 7 illustrates how the clocks are generated for up sampling. The example shows up sampling from an 11.025-KHz audio-input clock (frequency f0=11.025 KHz) to a 16-KHz audio output clock (f1=16 KHz). The output clock is the higher frequency clock, so it is first divided down by Q0/P0 in the linear interpolator stage to generate the mid clock. Then the mid clock is reduced by an additional factor of Q1/P1 to generate a pseudo-input clock having the audio input frequency of f0. The overall ratio of f0 tof1 is Q/P.

The audio output clock f1 is free-running. For every P0 (640) clocks, module-P0 counter 48 in the linear interpolator stage skips three clocks. The skipped clocks are spread out so that the 213$^{th}$, 426$^{th}$, and 639$^{th}$ clocks are skipped for every 640 clocks. Thus the mid clock has 637 pulses, although the overall period of time for the 637 mid-clock pulses is the same as for the 640 audio-output clock pulses. This mis-match in overall rates is not important when either the input or output audio streams are sent to memory rather than played in real time.

The linear interpolator has reduced the number of clock pulses slightly to generate the mid clock. The L-tap FIR filter stage reduces the number of clock pulses more drastically, since the ratio Q1/P1 is not close to one. Rather, for 11.025 KHz to 16 KHz up-sampling, only 9 pulses are enabled for every 13 mid-clock pulses. These 9 pulses are spread out over the 13 mid-clock pulses. The pattern of 9 enabled pulses for every 13 mid-clock pulses is repeated for all the 637 mid-clock pulses. When the mid-clock pulse is skipped by the linear interpolator stage, the pseudo audio-input clock generated does not generate a pulse for a longer period of time. Buffering the input audio samples allows the clock to be inactive for variable periods of time as shown.

Down Sampling Linear Interpolator—FIG. 8A

Figure 8B:
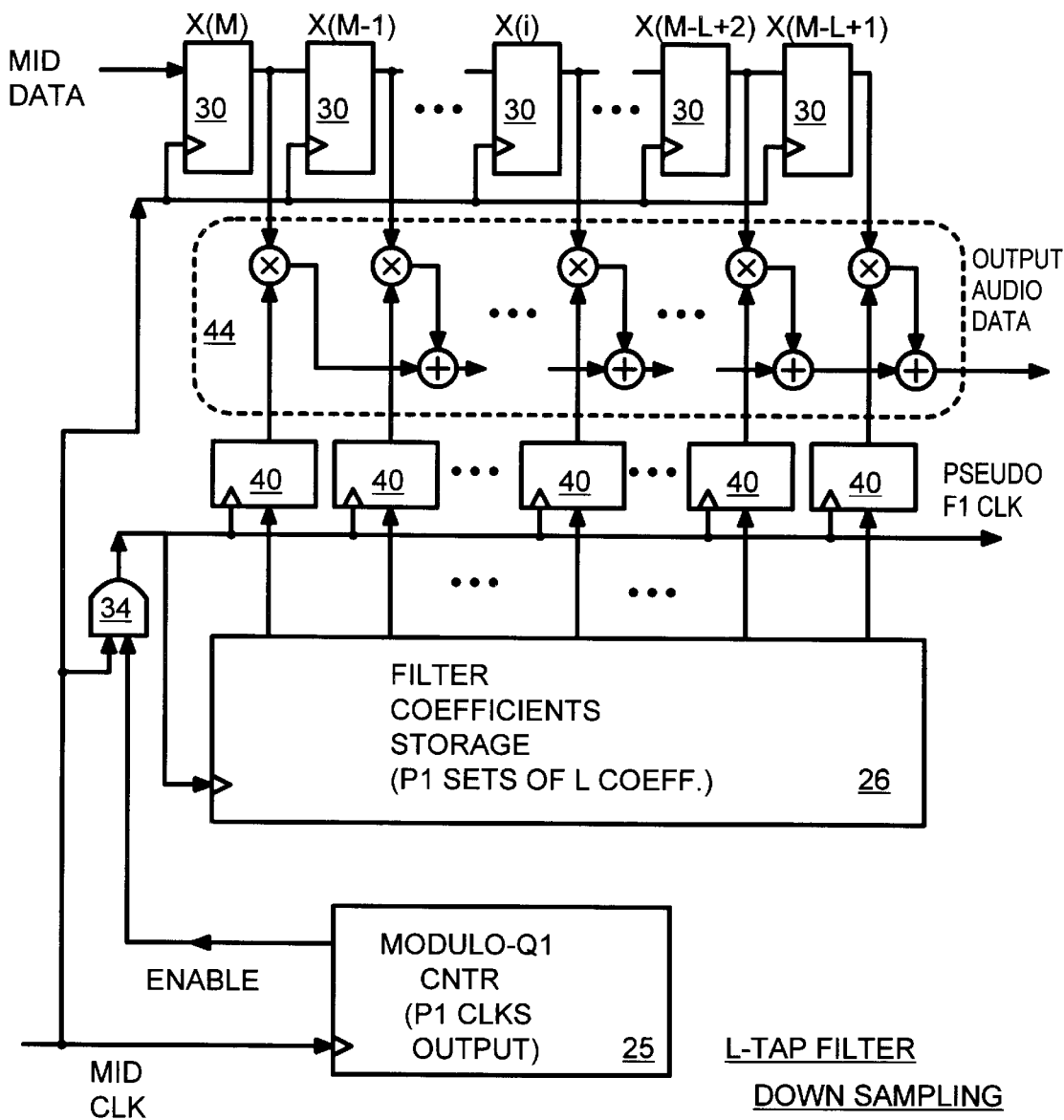

FIGS. 8A, 8B show in detail the two-stage sample rate converter configured for down sampling. FIG. 8A shows the first stage, containing linear interpolator 20, while FIG. 8B shows the second stage with L-tap FIR filter 22. The order of the stages is reversed for the down-sampling rate-conversion. The mid clock is still generated from the linear interpolator stage because the higher-frequency clock is the input clock for down-sampling conversions. However, the linear interpolator stage is the first stage, and the generation of the clocks is reversed.

The audio input (f0) clock is divided down slightly by the ratio Q0/P0 to generate the mid clock. One clock pulse is skipped for every few hundred clock pulses by module-Q0 counter 49. This mid clock generated by AND gate 46 is later divided down by the ratio Q1/P1 by the second stage, the L-tap FIR filter. Module-Q0 counter 49 receives the input audio clock and enables P0 of each Q0 pulses. AND gate 46 uses the enable signal from counter 49 to disable pulses of the mid clock. The free-running audio input clock is used to clock samples out of input FIFO 28 into registers 36, 38, which are also clocked by the audio input clock. Incrementer 96 and increment register 42 are clocked by the mid clock output from AND gate 96.

DSP 44 generates the interpolated sample from the samples in registers 36, 38, as discussed for FIG. 5B. However, fewer interpolated samples are generated than input samples. When a mid clock pulse is skipped, registers 36, 38 are clocked an extra time without generating an interpolated output. Incrementer 96 is programmed to roll-over the increment when registers 36, 38 are double-clocked. Thus the extra input sample is removed and interpolated into surrounding samples as the sample rate is reduced slightly.

The interpolated samples from DSP 44 are output to the second stage as mid data, synchronized to the mid clock which is also passed to the second stage. FIG. 8B shows that the mid clock is used to clock this mid data through the L data registers 30. The mid clock is also input to modulo-Q1 counter 25, which enables P1 pulses for every Q1 clock pulses input. AND gate 34 receives the enable from module-Q1 counter 25 and disables pulses in the ratio P1/Q1. The pseudo audio-output clock is output having an average frequency of f1. The pseudo output clock latches weighting coefficients into coefficient registers 40 from coefficient storage 26. DSP 44 generates the filtered sample output as described for FIG. 5A, but in synchronization to the pseudo f1 output clock.

When clock pulses are skipped, the mid data from the linear interpolator stage is double-clocked through the L data registers 30. The large number (L) of interpolated samples averaged together by the FIR filters ensures that the output audio data samples are smoothed despite the skipping of an interpolated sample.

The low integer value for P1 significantly reduces the storage requirement for coefficients in coefficient storage 26. For down-sampling from 11.025 KHz to 8 KHz, Q1/P1 is 11/8, so P1 is 8 compared with a Q/P of 441/320, and a P of 320. Thus the coefficient storage is reduced by 8/320, or 97.5%. Other sampling-rate conversions shown in FIG. 4 produce similar dramatic reductions in storage.

Figure 9:
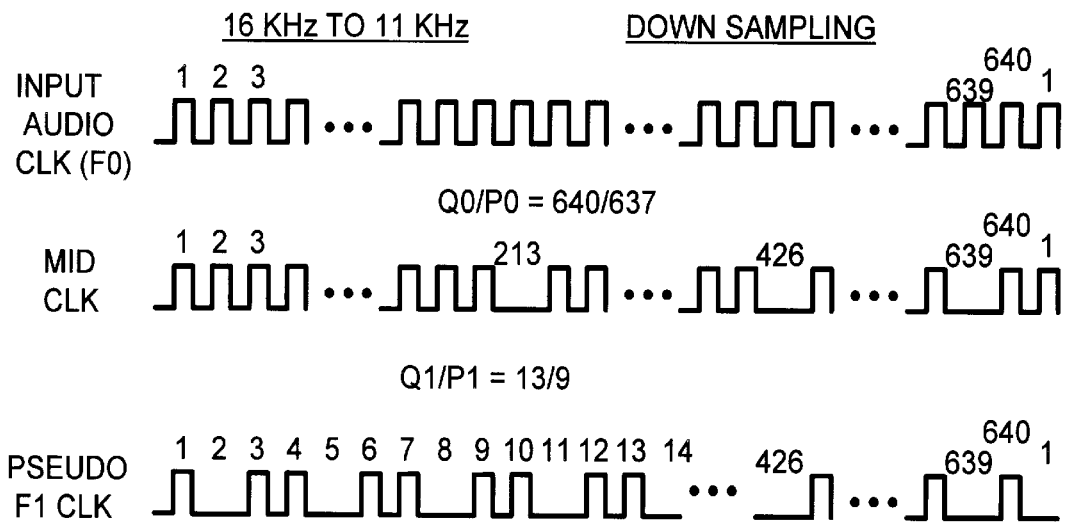
FIG. 9 illustrates how the clocks are generated for down sampling.

Clock Generation for Down-Sampling—FIG. 9

FIG. 9 illustrates how the clocks are generated for down sampling. The example shows down sampling from a 16-KHz audio-input clock (frequency f0=16 KHz) to an 11.025-KHz audio output clock (f1=11.025 KHz). The input clock is the higher frequency clock, so it is first divided down by Q0/P0 in the linear interpolator stage to generate the mid clock. Then the mid clock is reduced by an additional factor of Q1/P1 to generate a pseudo-output clock having the audio input frequency of f1. The overall ratio of f0 tof1 is Q/P. Note that the linear interpolator stage is the last stage for up-sampling, but the first stage for down-sampling. However, the mid clock is always generated from the linear interpolation stage from either the input or output audio clock.

The audio input clock f0 is free-running. For every Q0 (640) clocks, module-Q0 counter 49 in the linear interpolator stage skips three clocks. The skipped clocks are spread out so that the $213^{th}$, $426^{th}$, and $639^{th}$ clocks are skipped for every 640 clocks. Thus the mid clock has 637 pulses, although the overall period of time for the 637 mid-clock pulses is the same as for the 640 audio-output clock pulses.

The linear interpolator reduces the number of clock pulses slightly to generate the mid clock. The L-tap FIR filter stage (the first stage) reduces the number of clock pulses more drastically, since the ratio Q1/P1 is not close to one. Rather, for 16 KHz to 11.025 KHz down-sampling, only 9 pulses are enabled for every 13 mid-clock pulses. These 9 pulses are spread out over the 13 mid-clock pulses. The pattern of 9 enabled pulses for every 13 mid-clock pulses is repeated for all the 637 mid-clock pulses. When the mid-clock pulse is skipped by the linear interpolator stage, the pseudo audio-output clock generated does not generate a pulse for a longer period of time. Buffering the input audio samples allows the clock to be inactive for variable periods of time as shown.

Figure 10:
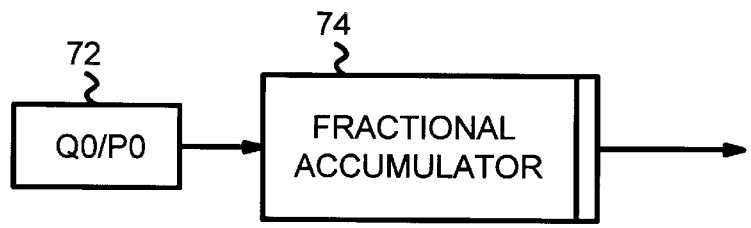
FIG. 10 is an incrementer for linear interpolation.

Detail of Incrementer—FIG. 10

FIG. 10 is an incrementer for linear interpolation. Register 72 contains the ratio Q0/P0 for up-sampling incrementer 96 of FIG. 5B, or the ratio P0/Q0 for the down-sampling incrementer 96 of FIG. 8A. Fractional accumulator 74 adds the ratio from register 72 to a running sum stored in a register in accumulator 74 to produce the increment value. The increment value is output to the DSP to be multiplied by the difference in the two most recent sample points.

Fractional accumulator 74 truncates the integer part of the Q0/P0 or P0/Q0 ratio so that only the fractional part is stored. Thus the increment is always between 1.0 and 0, inclusive. A different ratio is programmed into register 72 for different rate conversions; values for Q0 and P0 are shown in FIG. 4. For example, the ratio in register 72 for down-sampling from 11.025 to 8 KHz is P0/Q0 or 440/441, or 0.99773. The first increment is 0.99773, the second increment is 2*0.99773 truncated to 0.99546, the third increment is 3*0.99773, truncated to 0.99320, and so on. The $440^{th}$ increment is 440*0.99773, truncated to 0.00225, and the final increment when the incrementer is reset to zero is 0.00000, which occurs when the clock is skipped. The cycle of increments then repeats itself.

Figure 11:
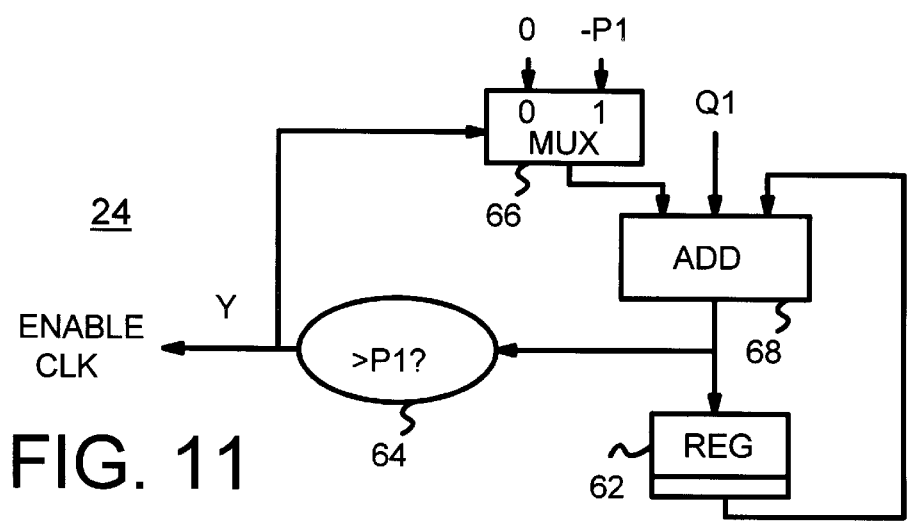
FIG. 11 is a detailed diagram of the module-P1 counter for dividing down the sample-rate clock in the L-tap FIR filter stage.

Detail of Module-P1 Counter—FIG. 11

FIG. 11 is a detailed diagram of the module-P1 counter for dividing down the sample-rate clock in the L-tap FIR filter stage. The purpose of module-P1 counter of FIG. 5A is to output Q1 enabled clock pulses for every P1 clocks input to the counter. The Q1 enabled pulses are preferably distributed as evenly as possible over the P1 clock periods.

Register 62 is initially cleared to zero. Adder 68 adds the accumulated value in register 62 to Q1 and the output of mux 66, which is usually zero. Thus register 62 increases for every clock period. However, when the value from adder 68 exceeds P1, comparator 64 switches mux 66 to output a negative P1. Thus P1 is subtracted from the accumulated value whenever the sum will exceed P1. This keeps the sum in register 62 between zero and P1 at all times.

Comparator 64 enables the clock pulse each time the result from adder 68 exceeds P1. A settable latch (not shown) can be triggered for any cycle that adder 68 initially is greater than P1. The settable latch is then cleared at the end of every cycle. Thus clocks are enabled each time the sum exceeds P1. When Q1 is close to P1, as for many common rate conversions, one or two pulses are disabled and then one or two pulses are enabled.

As an example, when P1 is 13 and Q1 is 9, for each cycle of 13 input clocks, 9 output clocks are enabled. The enabled clocks are clocks 1, 3, 4, 6, 7, 9, 10, 12, 13.

For the down-sampling module-Q1 counter 25 of FIG. 8B, the Q1 and P1 values in FIG. 11 are reversed. Many other arrangements for module counters may be substituted.

ADVANTAGES OF THE INVENTION

Coefficient storage for the L-tap low-pass finite-impulse-response (FIR) filter is dramatically reduced by reducing the P factor. The factor P is reduced by using two stages, with each stage adjusting the sampling rate by a different ratio. A first stage adjusts the sampling rate by Q0/P0, while a second stage further adjusts the sampling rate by Q1/P1.

The small integer for P1 drastically reduces the coefficient storage required for the FIR filter, since P1 sets of L coefficients are stored. For example, the prior-art filter of FIG. 1 uses a Q/P ratio of 320/441 for 8-KHz to 11.025-KHz up-sampling, which requires P sets of L coefficients, or 441*16=7065 coefficients for a 16-tap filter (L=16). The invention of FIG. 3A uses a Q1/P1 ratio of 8/11, or a P1 of 11. Only 11*L=176 coefficients need to be stored for a 16-tap filter using the invention. Coefficient storage is thus reduced by 97%. The reduced coefficient storage significantly reduces the die area and cost for the sample-rate converter, allowing it to be integrated onto a crowded multimedia controller chip.

ALTERNATE EMBODIMENTS

Several other embodiments are contemplated by the inventor. For example other arrangements for the incrementer and module counters are possible. These may also be implemented in the DSP's firmware. While the values for Q0, P0, Q1, P1 in FIG. 4 are thought to be optimized values, other values are possible which still reduce the coefficient storage requirements, although perhaps not as significantly.

The DSP can be a simplified DSP core or a more complex general-purpose DSP. The functions of the DSP can be reduced to hardware logic gates, either performing the multiplication and addition operations serially or in parallel. The audio sample-rate converter can be integrated into an audio controller integrated circuit chip, or as part of a larger system chip such as an integrated multimedia controller which includes a graphics controller. The sample-rate converter can also be integrated with an audio A/D or D/A converter.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX - SAMPLE CODE
```
void CSMPView::WaveResamplingFixedPoint(LPVOID OutputBuf)
{
long i,j,k;
BYTE *InputBuf;
InputBuf = (BYTE *)InBuf;
    static long
DelaySampleL0,DelaySampleL1,DelaySampleL2,DelaySampleR0,
DelaySample
R1,DelaySampleR2;
long   RdPtr=0, Temp1,Temp2;
static long Accumulator=0, No2Accumulator=0, No2AccumulatorNorm=0;
static long  FilterCoefPtr=0, FilterDataPtr=0, AdjFilterCoefPtr=-1;
static long  FilterData1[MaxFilterTapNum];   //for left channel or mono
```

```
static long   FilterData2[MaxFilterTapNum];   //for right channel
unsigned    StartCycleLo, StartCycleHi, EndCycleLo, EndCycleHi;
long
double      TotalCycle;
for(i=0; i<(long)OutputFrameSize; ++i)
{
    if(FilterCoefSet = = ReducedSetsPostLinearFilter)
        Temp1 = DelaySampleL1 + (((DelaySampleL0 -
DelaySampleL1)*(No2AccumulatorNorm>>(No2QNormBits-
PreLinearFilterCoefBits)))>>PreLinearFilterCoefBits);
    else
    {
        Temp1=0;
        for(j=1; j <=FilterTapNum; ++j)
        {
            Temp1 +=
(((long*)FilterCoef)[FilterCoefPtr]*FilterData1[(FilterDataPtr-
j)&MaxFilterTapMask])>>BitsOfShiftAfterMul;
            if((++FilterCoefPtr) >= FilterTapNum*PPP)
                FilterCoefPtr=0;
        }
    }
    Temp1 = Temp1>>BitsOfShiftAfterFilter;
    if(Temp1>=32768)
        Temp1=32767;
    else if(Temp1 <-32768)
    Temp1=-32768;
    ((short *)OutputBuf)[i]= (short)Temp1;
    if(FilterCoefSet = = ReducedSetsPostLinearFilter)
    {
        No2Accumulator += No2Q;
        No2AccumulatorNorm += No2QNorm;
        while(No2Accumulator >= No2P)
        {
            DelaySampleL1=DelaySampleL0;
            DelaySampleL0=0;
            for(j=1;j<=FilterTapNum; ++j)
            {
                DelaySampleL0 +=
(((long*)Filtercoef)[FilterCoefPtr]*FilterData1[(FilterDataPtr-
j)&MaxFilterTapMask])>>BitsOfShiftAfterMul;
                if((++FilterCoefPtr) >= FilterTapNum*PPP)
                    FilterCoefptr=0;
            }
            Accumulator += QQQ;
            while(Accumulator >= PPP)
            {
                if(MyWaveFormat==My 16bitMono)
                {
FilterData1[(FilterDataPtr+0)&MaxFilterTapMask]=(long)(((short
*)InputBuf)[RdPtr]);
                }
                else
                {
                    Temp1=((BYTE *)InputBuf)[RdPtr];
FilterData1[(FilterDataPtr+0)&MaxFilterTapMask) =
(long)(short)((Temp1<<8) 0x8000);
                }
                ++RdPtr;
                ++FilterDataPtr;
                Accumulator -= PPP;
            }
            No2Accumulator -= No2P;
            if(No2Accumulator= =0)
                No2AccumulatorNorm =0;
            else
                No2AccumulatorNorm =
No2AccumulatorNorm&No2QNormMask;
        }
    } //if FilterCoefset == PostLinearFilter
    else //if FilterCoefset == PreLinearFilter or FullSet
    {
        Accumulator += QQQ;
        while(Accumulator >= PPP)
        {
            if(FilterCoefset != ReducedSetsPreLinearFilter)
FilterData1[(FilterDataPtr+0)&MaxFilterTapMask]=DelaySampleL0;
            else
FilterData1[(FilterDataPtr+0)&MaxFilterTapMask]=DelaySampleL1 +
            else
(((DelaySampleL0 - DelaySampleL1)*(No2AccumulatorNorm>>
(No2QNormBits-
PreLinearFilterCoefBits)))>>PreLinearFilterCoefBits);
            No2Accumulator += No2Q;
            No2AccumulatorNorm += No2QNorm;
            while(No2Accumulator >= No2P)
            {
                DelaySampleL1=DelaySampleL0;
                DelaySampleL0=(long)(((short
*)InputBuf)[RdPtr]);
                if(MyWaveFormat==My16bitMono)
                {
                    DelaySampleL0=(long)(((short
*)InputBuf)[RdPtr]);
                }
                else
                {
                    Temp1=((BYTE *)InputBuf)[RdPtr];
                    DelaySampleL0 =
(long)(short)((Temp1<<8) 0x8000);
                }
                ++RdPtr;
                No2Accumulator -= No2P;
                if(No2Accumulator==0)
                    No2AccumulatorNorm =0;
                else
                    No2AccumulatorNorm =
No2AccumulatorNorm&No2QNormMask;
            ++FilterDataPtr;
            Accumulator -= PPP;
        } //while(Accumulator >= PPP)
    } //if FilterCoefSet == PreLinearFilter or FullSet
} //for(i=0; i<(long)OutputFrameSize; ++i)
} //WaveResamplingFixedPoint
```

I claim:

1. A sample-rate filter-converter for converting input audio samples of an input rate to output audio samples at an output rate, the sample-rate filter-converter comprising:

an L-tap finite-impulse-response (FIR) filter having a filter input and a filter output of audio samples at different sample rates, the FIR filter generating a sample for the filter output by summing L weighting coefficients multiplied with L most-recent samples of the filter input;

a linear interpolator having an interpolator input and an interpolator output of audio samples at different sample rates, the linear interpolator generating a sample for the interpolator output by interpolating between two adjacent samples of the interpolator input; and programmable control means, coupled to the FIR filter and to the linear interpolator, for sending the input audio samples to the filter input and connecting the filter output to the interpolator input when the input rate is less than the output rate so that up-sampling occurs, the interpolator output providing the output audio samples at the output rate, whereby the FIR filter and the linear interpolator convert the input audio samples at the input rate to the output rate.

2. The sample-rate filter-converter of claim 1 wherein the programmable control means sends the input audio samples to the interpolator input and connects the interpolator output to the filter input when the input rate is greater than the output rate so that down-sampling occurs, the filter output providing the output audio samples at the output rate, whereby down-sampling occurs by reversing an order of the FIR filter and the linear interpolator.

3. The sample-rate filter-converter of claim 2 further comprising:

coefficient retrieval means, coupled to the FIR filter, for fetching a different set of L weighting coefficients for each sample generated for the filter output for a cycle of P1 samples generated, wherein P1 is an integer less than thirty;

wherein a ratio of a rate of samples at the filter input and filter output is a filter ratio of Q1/P1, the filter ratio being approximately but not equal to a ratio of the input rate and the output rate, whereby coefficient storage is reduced.

4. The sample-rate filter-converter of claim 3 wherein the FIR filter comprises:

a chain of L registers for storing L most-recent samples from the filter input;

digital-signal processor DSP means, receiving a set of the L weighting coefficients from the coefficient retrieval means, for multiplying each of the L most-recent samples from the chain of L registers with a corresponding weighting coefficient in the set of the L weighting coefficients, the DSP means further forming a sum of all L results of multiplication, the sum being output as a sample to the filter output.

5. The sample-rate filter-converter of claim 1 further comprising:

clock input means, receiving a free-running input clock at the input rate when the input rate exceeds the output rate, the clock means receiving a free-running output clock at the output rate when the output rate exceeds the input rate, the clock means for outputting either the input clock or the output clock as a higher-speed clock;

first reducing means, coupled to the linear interpolator and the clock means, for reducing a rate of the higher-speed clock to generate a mid clock having a mid rate, the first reducing means reducing either the input rate or the output rate by an interpolator ratio of about but not exactly one;

second reducing means, coupled to the FIR filter and receiving the mid clock, for reducing the mid rate of the mid clock by a filter ratio to generate a pseudo clock, the second reducing means reducing the mid rate by the filter ratio of two integers each less than thirty, the filter ratio being approximately but not equal to a ratio of the input rate and the output rate, wherein the pseudo clock has the input rate when the input rate is less than the output rate, but the pseudo clock having the output rate when the input rate is greater than the output rate.

6. The sample-rate filter-converter of claim 5 wherein the first and second reducing means each comprise a module counter for enabling clock pulses, the module counter enabling some but not all clock pulses of a clock input to the modulo counter to reduce a clock rate in proportion to either the filter ratio or the interpolator ratio, whereby modulo counters are used to reduce clock ratios.

7. The sample-rate filter-converter of claim 5 wherein the pseudo clock is an asymmetric clock having some pulses of a same duration as the higher-speed clock, but other pulses being multiples of the higher-speed clock.

8. The sample-rate filter-converter of claim 5 wherein the interpolator ratio of about but not exactly one is within one-percent of exactly one and wherein the filter ratio is within five percent of the ratio of the input rate and the output rate, whereby the FIR filter coarsely adjusts a sampling rate while the linear interpolator finely adjusts the sampling rate.

9. The sample-rate filter-converter of claim 1 wherein the linear interpolator comprises:

a first register coupled to receive the interpolator input;

a second register coupled to receive an output from the first register;

an incrementer for generating an increment being a ratio of rates of the interpolator input and the interpolator output, the incrementer outputting the increment;

DSP means, receiving the increment and coupled to the first and second registers, for multiplying the increment by a difference between sample values from the first and second registers and adding a result of the multiplying to the second register to generate an interpolated sample for the interpolator output.

10. A computer-implemented method for converting sample rates, the method comprising the computer-implemented steps of:

when up-sampling occurs and an input rate of input samples is less than an output rate of output samples:

receiving an output clock at the output rate and generating an increment and an output sample for each pulse of the output clock;

generating a mid clock having a mid rate within one percent of the output rate but not exactly equal to the output rate, the output clock being reduced by an interpolator ratio to generate the mid clock;

generating a pseudo clock having an average rate equal to the input rate by reducing the mid clock by a filter ratio, the filter ratio being a ratio of two integers each less than thirty, the filter ratio being about but not exactly equal to a ratio of the input rate and the output rate;

clocking the input samples sequentially through a chain of L registers with each pulse of the pseudo clock;

reading a set of L filter coefficients from a memory and multiplying each filter coefficient with one of the L registers to produce L results for each pulse of the mid clock;

summing the L results to produce a mid sample for each pulse of the mid clock;

transferring the mid sample to a first register containing a first sample, and transferring a previous first sample in the first register to a second register on each pulse of the mid clock; and interpolating between the first sample in the first register and a second sample in the second register using the increment to generate the output sample for each pulse of the output clock, whereby the input samples are sample-rate converted to the output samples at the output rate by filtering while increasing a sample rate by the filter ratio and linear interpolation while increasing a sample rate by the interpolator ratio.

11. The computer-implemented method of claim 10 further comprising the computer-implemented steps of:

when down-sampling occurs and the input rate of input samples is greater than the output rate of output samples:

receiving an input clock and the input samples at the input rate;

generating the mid clock having the mid rate within one percent of the input rate but not exactly equal to the input rate, the input clock being reduced by the interpolator ratio to generate the mid clock;

generating the pseudo clock having an average rate equal to the output rate by reducing the mid clock by the filter ratio, the filter ratio being a ratio of two integers each less than thirty, the filter ratio being about but not exactly equal to the ratio of the input rate and the output rate;

transferring the input sample to the first register, and transferring the previous first sample in the first register to a second register on each pulse of the input clock;

generating the increment for each pulse of the mid clock;

interpolating between the first sample in the first register and the second sample in the second register using the increment to generate the mid sample for each pulse of the mid clock;

clocking the mid samples sequentially through the chain of L registers with each pulse of the mid clock;

reading the set of L filter coefficients from the memory and multiplying each filter coefficient with one of the L registers to produce L results for each pulse of the pseudo clock; and summing the L results to produce the output sample for each pulse of the pseudo clock;

whereby the input samples are sample-rate converted to the output samples at the output rate by filtering while decreasing a sample rate by the filter ratio and linear interpolation while decreasing a sample rate by the interpolator ratio.

12. The computer-implemented method of claim 11 wherein the step of reading the set of L filter coefficients from the memory comprises:

reading a different set of L filter coefficients for P1 clock pulses, wherein the filter ratio is a ratio of P1 and another integer less than thirty.

* * * * *